United States Patent
Galster

(10) Patent No.: US 6,469,368 B2
(45) Date of Patent: Oct. 22, 2002

(54) METHOD FOR PRODUCING A HIGH-SPEED POWER DIODE WITH SOFT RECOVERY, AND A POWER DIODE PRODUCED USING SUCH A METHOD

(75) Inventor: Norbert Galster, Rupperswil (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 09/897,027

(22) Filed: Jul. 3, 2001

(65) Prior Publication Data

US 2002/0003287 A1 Jan. 10, 2002

(30) Foreign Application Priority Data

Jul. 10, 2000 (EP) .............................. 00810603

(51) Int. Cl.[7] ..................... H01L 29/167; H01L 29/207; H01L 29/227
(52) U.S. Cl. ........................ 257/611; 257/655; 257/656; 438/543
(58) Field of Search ................ 438/514, 543; 257/611, 655, 656

(56) References Cited

U.S. PATENT DOCUMENTS

| | | | |
|---|---|---|---|
| 4,140,560 A | 2/1979 | Rodov | 148/188 |
| 4,281,336 A | 7/1981 | Sommer et al. | 357/38 |
| 5,747,872 A * | 5/1998 | Lutz et al. | 257/611 |
| 6,351,024 B1 * | 2/2002 | Ruff et al. | 257/655 |

FOREIGN PATENT DOCUMENTS

| | | |
|---|---|---|
| DE | 4135258 A1 | 4/1993 |
| DE | 4337329 A1 | 5/1995 |
| DE | 19609244 A1 | 9/1997 |
| EP | 0878849 A2 | 11/1998 |
| JP | 08102545 | 4/1996 |

* cited by examiner

Primary Examiner—David Nelms
Assistant Examiner—Tu-Tu Ho
(74) Attorney, Agent, or Firm—Burns, Doane, Swecker & Mathis, L.L.P.

(57) ABSTRACT

In a method for producing a high-speed power diode with soft recovery, in which method the carrier life within the associated semiconductor substrate (10) is governed by first, unmasked bombardment (14) with an axial profile and by subsequent, second, masked bombardment (15) with a lateral profile, improved reverse characteristics are achieved in that the first, unmasked bombardment is ion bombardment (14) which governs the switching response of the power diode and in that the second, masked bombardment is electron bombardment (15), which reduces the active area of the power diode. In a power diode equipped with such a semiconductor substrate (10), the thermal resistance $R_{th}$ is reduced in relation to the active area of the power diode.

9 Claims, 4 Drawing Sheets

METHOD FOR PRODUCING A HIGH-SPEED POWER DIODE WITH SOFT RECOVERY, AND A POWER DIODE PRODUCED USING SUCH A METHOD

BACKGROUND OF THE INVENTION

1. Field of the Invention

The present invention relates to the field of power electronics. It relates in particular to a method for producing a high-speed power diode with soft recovery, and to a power diode.

2. Background Information

Particularly with low bias currents and high voltages, an abrupt breakdown in the reverse current, which is referred to as a "snap off", occurs during the commutation, without any circuitry, of high-speed, optimized-loss and optimized-reliability diodes (that is to say a diode having a semiconductor substrate which is distinguished by the silicon being thin and by a high basic material resistance).

As described in a number of places, such a "snap-off" or such a hard switching response can be shifted by various measures toward higher voltages, which are above the voltages that occur during operation. This is achieved by an axial profile of the carrier life in the component, which is produced, for example, by diffusion of heavy-metal atoms or by ion bombardment (He++ or H+).

For example, U.S. Pat. No. 4,140,560 has proposed that a gold concentration with a pronounced concentration gradient be produced in the substrate, leading to soft recovery, by diffusion of gold atoms into the semiconductor substrate of a high-speed diode.

The "snap-off" is also assisted by a short effective charge carrier life, as is required for large-area diodes designed for low dynamic losses. Reducing the switch-off losses by increasing the ion dose in the case of diodes which are bombarded purely by ions is also limited by the high reverse current in the component which results in consequence.

In consequence, neither combined bombardment with ions and electrons nor increase in the ion dose achieves the aim.

According to another known proposal (DE-A1-41 35 258) the semiconductor substrate of a high-speed power diode is subdivided by specific partial treatment (for example bombardment with protons or helium nuclei and electron bombardment) into two separate area elements located alongside one another. The partial diodes formed in this way differ in that one partial diode has soft recovery while the other has a hard "snap off" response. The desired overall diode response is obtained by connecting the two diode elements in parallel.

It has also been proposed (DE-A1-196 09 244) for the two abovementioned diode elements to be designed in such a way that regions are arranged distributed in an area of the semiconductor substrate which is not subjected to bombardment or is subjected to basic bombardment with electrons, in which regions bombardment or additional bombardment has been carried out. A mask in the form of strips is used, for example, to produce the distributed regions. This results in the carrier life having a lateral profile in addition to the axial profile. The combination of the two profiles then leads to the desired diode switching response.

The high-speed power diodes produced using the known methods and with soft recovery admittedly have a better switching response, but have undesirably high reverse currents and reverse losses.

SUMMARY OF THE INVENTION

The object of the invention is thus to specify a method for producing a high-speed power diode with soft recovery, which leads to components with low reverse losses, and to specify a power diode produced using this method.

The object is achieved by the totality of the features of claims 1 and 8. The essence of the invention is that, after ion bombardment over the entire surface, the component is masked during the subsequent electron bombardment to produce a three-dimensional life distribution. In principle, this results in two diode sub-areas, which can be regarded as parallel-connected diodes with different dynamic and steady-state characteristics. The diode part with a high bombardment dose (ion bombardment+electron bombardment) has a very high conduction resistance and carries virtually no forward current. Accordingly, its proportion of the total storage charge of the diode is low. The other sub-area (the part not subject to electron bombardment) carries virtually the entire forward current and governs the "recovery charge" and recovery response.

Since this greatly reduces the active area, it results in increased current densities with a relatively long carrier life, which leads to correspondingly soft snap-off response. The bombardment with electrons leads to the increase in the reverse current being less than that for pure ion bombardment for a comparable forward voltage drop, so that the reverse losses also remain low. The reduced active area also means that there are sub-areas of the diode which, owing to the additional bombardment, carry no forward current, or only a reduced forward current, and thus produce no switching losses, or only small switching losses, when the diode is being switched off. Thus, overall, the area in which switch-off losses are generated becomes smaller. The heat losses which are produced are, however, dissipated outward distributed over the entire substrate area, as before. This results in a reduction in the thermal resistance $R_{th}$ being achieved, related to the active area of the diode.

A first preferred refinement of the method according to the invention is distinguished in that a perforated plate, preferably composed of steel or molybdenum, is used for the second, masked bombardment. Such a mask allows the regions of the two diode elements to be distributed optimally.

Further profiling in the lateral direction can be achieved if, according to a second preferred refinement to the invention, a gauze, preferably composed of steel wire, is used for the second, masked bombardment. With an electron acceleration energy of, for example, 2.5 MeV, such a gauze with a wire thickness of 1 mm leads to total shielding at the node points and to partial shielding in the areas which are covered once, which leads to a limited electron penetration depth into the silicon, and thus to an additional defect profile. The bombardment takes place with its full energy in the areas which are not covered, which results in the production of an axially constant defect distribution.

The surface area which is not covered by the mask is preferably between 20% and 80%, preferably approximately 50%, of the total area of the mask.

BRIEF DESCRIPTION OF THE DRAWINGS

Preferred embodiment/s of the invention is/are disclosed in the following description and illustrated in the accompanying drawings, in which.

DETAILED DESCRIPTION OF THE INVENTION

Figure 1:
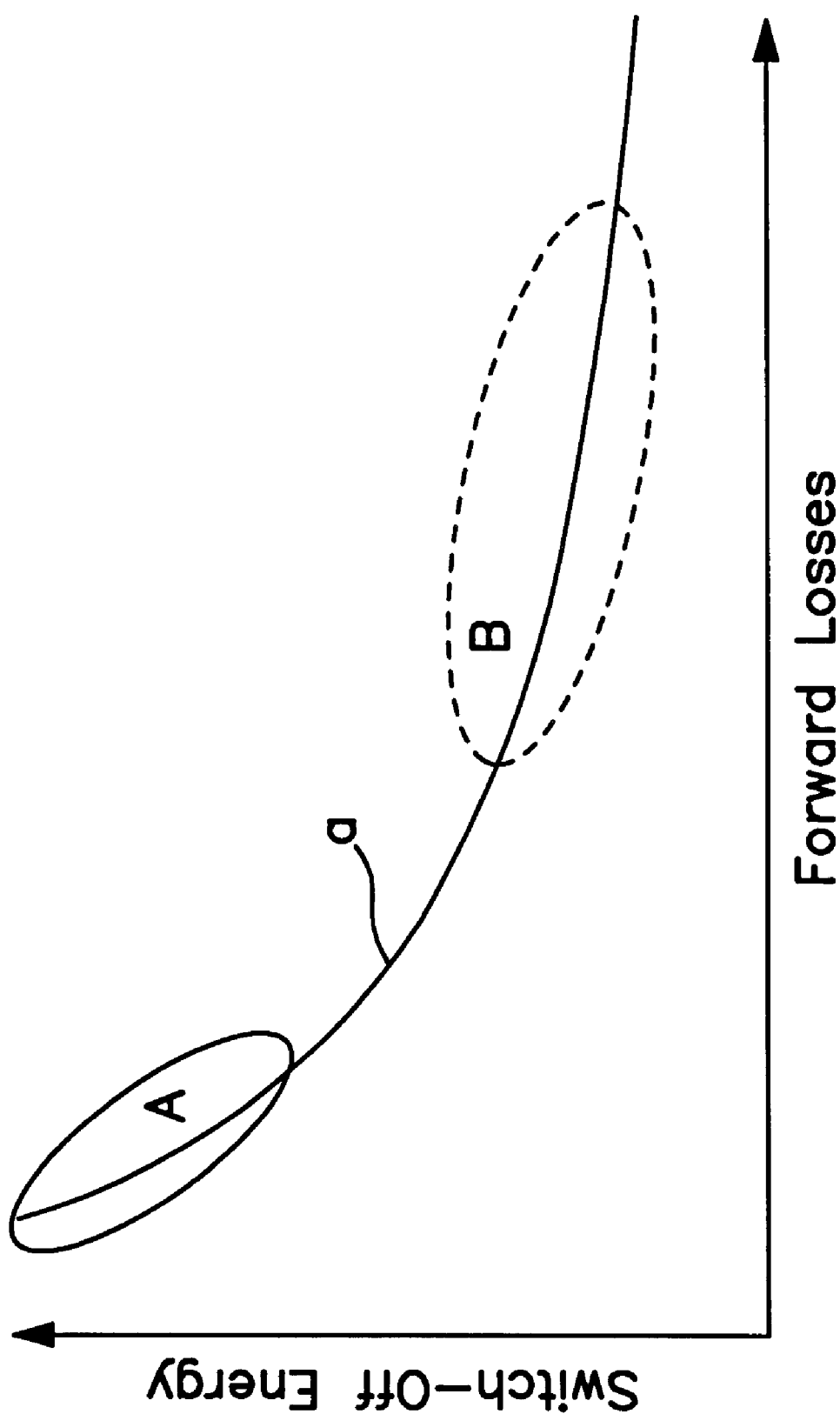
FIG. 1 shows an example of a "technology curve" (a), with whose aid power diodes can be characterized, with dynamic switching losses (generally $E_{off}$) being plotted against steady-state line losses.

Power diodes can be characterized by means of a "technology curve", as it is referred to, that is to say dynamic switching losses (generally $E_{off}$ or the switch-off energy) are plotted against the steady-state line losses (forward losses). One such technology curve is shown by way of example in FIG. 1.

The position of the technology curve in the graph is the result of the choice of the initial silicon material (diameter, thickness and resistivity) for the semiconductor substrate of the diode and the nature of the life distribution. Different technology curves are therefore obtained for different life technologies and different silicon material specifications.

The position of individual components on one of these technology curves is governed by the absolute value of the carrier life for a given technology. In order to shift a component from the area "A" to the area "B" (see FIG. 1) on the technology curve for a given diameter and given silicon thickness and silicon resistivity, the carrier life must be reduced further. This can be achieved by (a) increasing the electron bombardment dose or (b) additional heavy-metal diffusion, or (c) additional ion bombardment.

Method (a) leads to a diode with a tendency to hard recovery characteristics when being switched off, while methods (b) and (c) lead, however, to a high leakage current and thus to high reverse losses and, in the worst case, to reverse-operation instability.

The problem can be overcome by the life of a diode whose qualitative switching response is already governed by a laterally homogenous life distribution additionally being laterally structured by means of further masked bombardment. According to the invention, the first distribution is carried out in a manner known per se by ion bombardment so as to produce an axial life profile, and the diode characteristics are located in the area "A" of FIG. 1. Additional lateral structuring results in a diode having a three-dimensional (3D) life profile and electrical characteristics in the area "B" of the technology curve, without significantly influencing the qualitative recovery characteristics or the reverse losses. The diode can in this case be subdivided into two diode elements, in which case the double-bombarded part (ion bombardment+electron bombardment) can be regarded as being electrically deactivated.

Figure 2A:
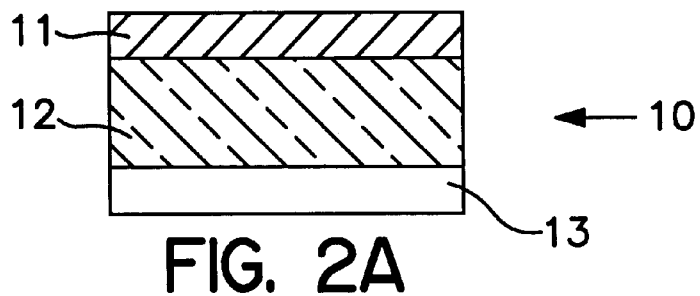
FIGS. 2A to 2D to show various steps in production methods according to two preferred exemplary embodiments of the invention.
Figure 2B:
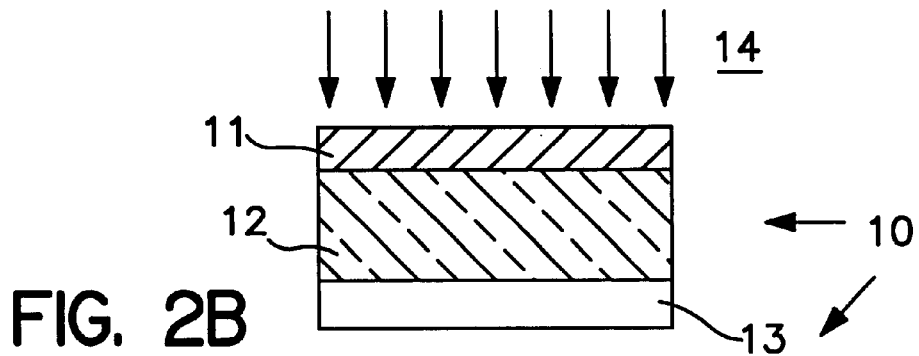

The 3D life distribution is achieved by masking the component during the electron bombardment. The fundamental method steps are illustrated, for two alternatives, in FIG. 2. These steps are based on a (flat) semiconductor substrate 10 in which, using suitable doping methods, a number of layers 11, 12 and 13 of a different conduction type and doping concentration have been produced (FIG. 2A). The layer 11 is normally p-doped, the layer 12 $n^-$-doped, and the layer 13 $n^+$-doped.

An axially (in the current direction) varying but laterally (transversely with respect to the current) homogeneous profile of the carrier life is now produced in a first step (FIG. 2B) in this semiconductor substrate (10) by unmasked ion bombardment 14.

Then, in a subsequent second step (FIG. 2C or alternatively FIG. 2D), a laterally inhomogeneous life profile is produced by masked electron bombardment 15. A perforated plate 16 composed of steel or molybdenum may be used, for example, as the bombardment mask (in the alternative in FIG. 2C). In this case, two diode sub-areas are in principle obtained, which can be regarded as parallel-connected diodes with different dynamic and steady-state characteristics. The diode element having a high bombardment dose (areas which match the holes 17 in the perforated plate 16) has a very high conduction resistance and carries virtually no forward current. Correspondingly, its proportion of the total storage charge of the diode is low. The other sub-area (the part not bombarded with electrons) carries virtually the entire forward current and governs the "recovery charge" and the recovery response.

Since the active area is thus greatly reduced, this results in increased current densities with a relatively soft carrier life, which leads to a correspondingly soft snap-off response. The bombardment with electrons leads to less increase in the reverse current than pure ion bombardment for a comparable forward voltage drop, so that the reverse losses also remain low.

Figures 2C, 2D:
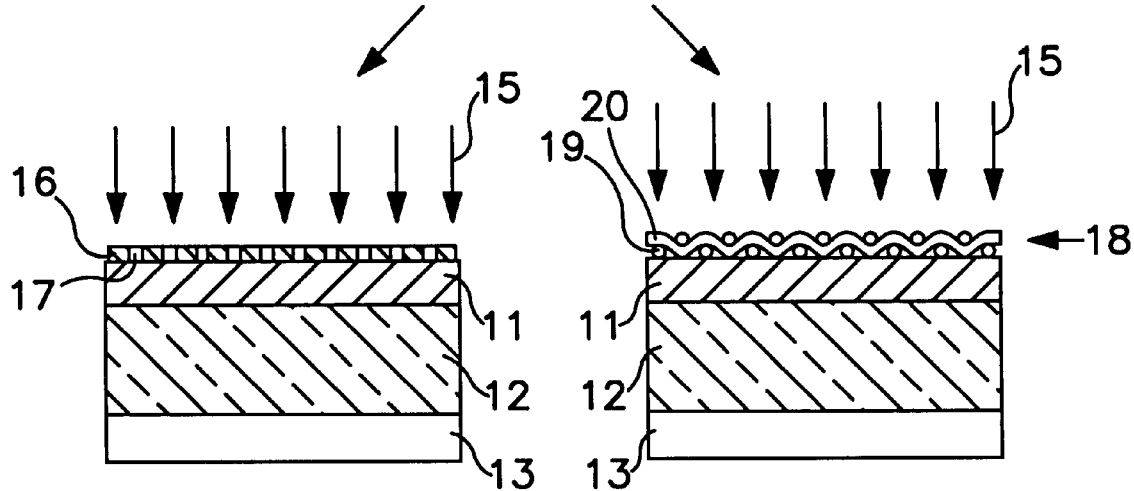

Further (lateral) profiling of the life by means of electron bombardment can be achieved by using differently designed masks, such as a gauze 18 composed of steel wires 19, 20 with a defined mesh width (the alternative in FIG. 2D). For an electron acceleration energy of, for example, 2.5 MeV, such a gauze 18 with the steel wires 19, 20 having a thickness of 1 mm leads to total shielding at the node points and to partial shielding in the areas which are covered once (by only one of the steel wires 19, 20), which leads to a limited electron penetration depth into the silicon, and thus to an additional defect profile. The bombardment takes place with its full energy in the areas (between the wires 19, 20) which are not covered, which results in the production of an axially constant defect distribution.

Figure 3:
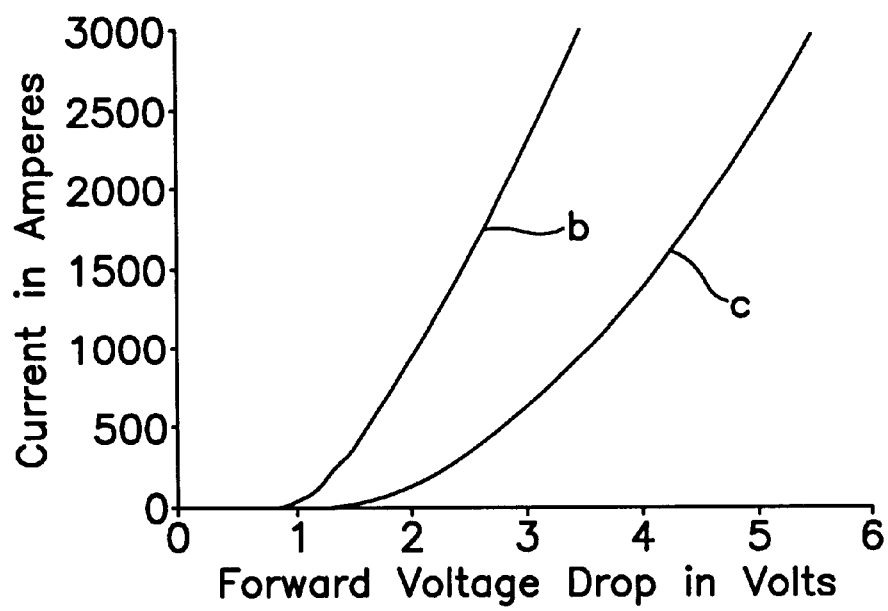
FIG. 3 shows the current distribution in an example of a diode with a 3D life profile according to the invention. Curve (b) is the forward characteristic of the diode element with pure proton bombardment. Curve (c) is the diode element with additional electron bombardment.
Figure 4:
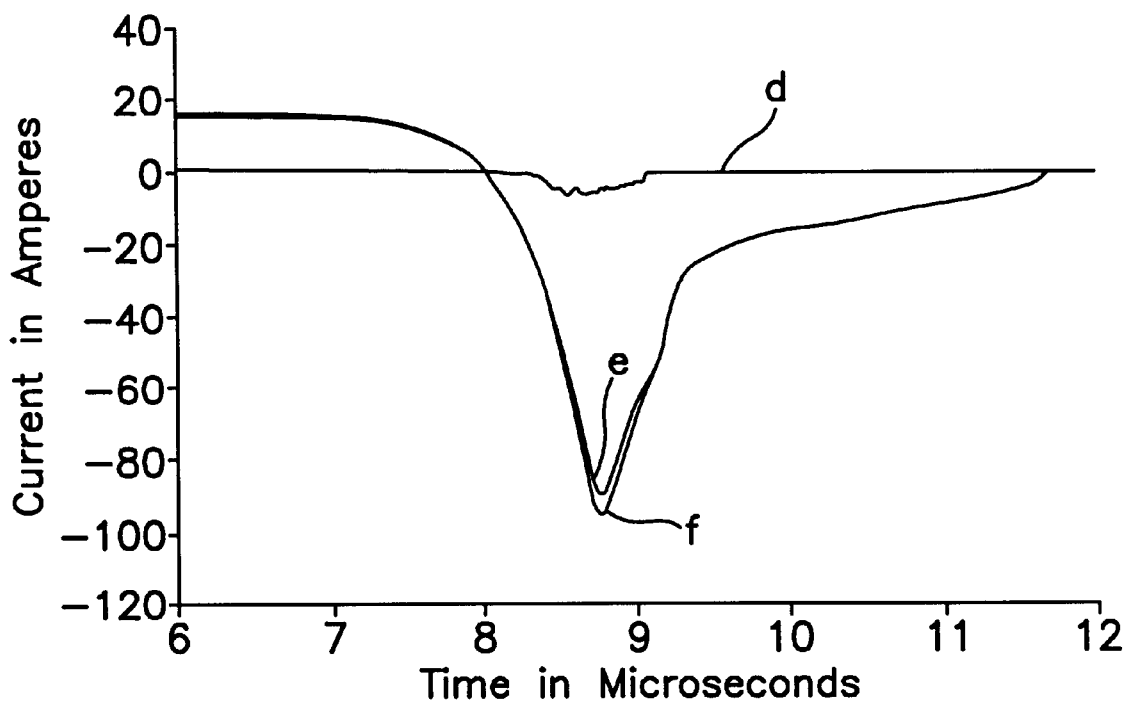
FIG. 4 shows the recovery of the diode from FIG. 3; curve (e) is the current when the diode element with pure proton bombardment is being switched off. Curve (d) is the diode element with additional electron bombardment. Curve (f) is the total current.

The method according to the invention leads to high-speed power diodes whose electrical characteristics are illustrated, by way of example, by the curves for the diode elements in FIGS. 3 and 4. FIGS. 3 and 4 in this case show how the current is split between the two diode elements with an area ratio of 1:1 (between regions which are bombarded once and twice) for operation in the forward direction (FIG. 3) and while being switched off (FIG. 4) for a diode with proton bombardment over the entire surface and with masked, additional electron bombardment. The curve (b) in FIG. 3 shows the forward characteristic of the diode element with pure proton bombardment. The curve (c) characterizes the diode element with additional electron bombardment. It can be seen that the forward current of the diode element which has been bombarded with protons and electrons is very much less than the forward current in the diode element which has been bombarded purely with protons.

Curve (e) in FIG. 4 shows the current while the diode element which has been bombarded purely with protons is being switched off. Curve (d) the current in the diode element with additional electron bombardment. Curve (f) shows the total current, that is to say the sum of the currents in the two diode elements.

It is self-evident that the diode characteristics can be influenced by the ratio of the sub-areas of the two diode elements to one another. For practical applications, the electrically "deactivated" part (the diode element which has been bombarded with protons and electrodes) can make up 20% to 80% of the total area. The nature and configuration of the mask are determined in a corresponding manner. The configuration for a diode with the above characteristics (area ratio, active area to total area of approximately 1:2) comprises a steel gauze with a wire diameter of 1 mm and a mesh width of 2 mm.

Figure 5:
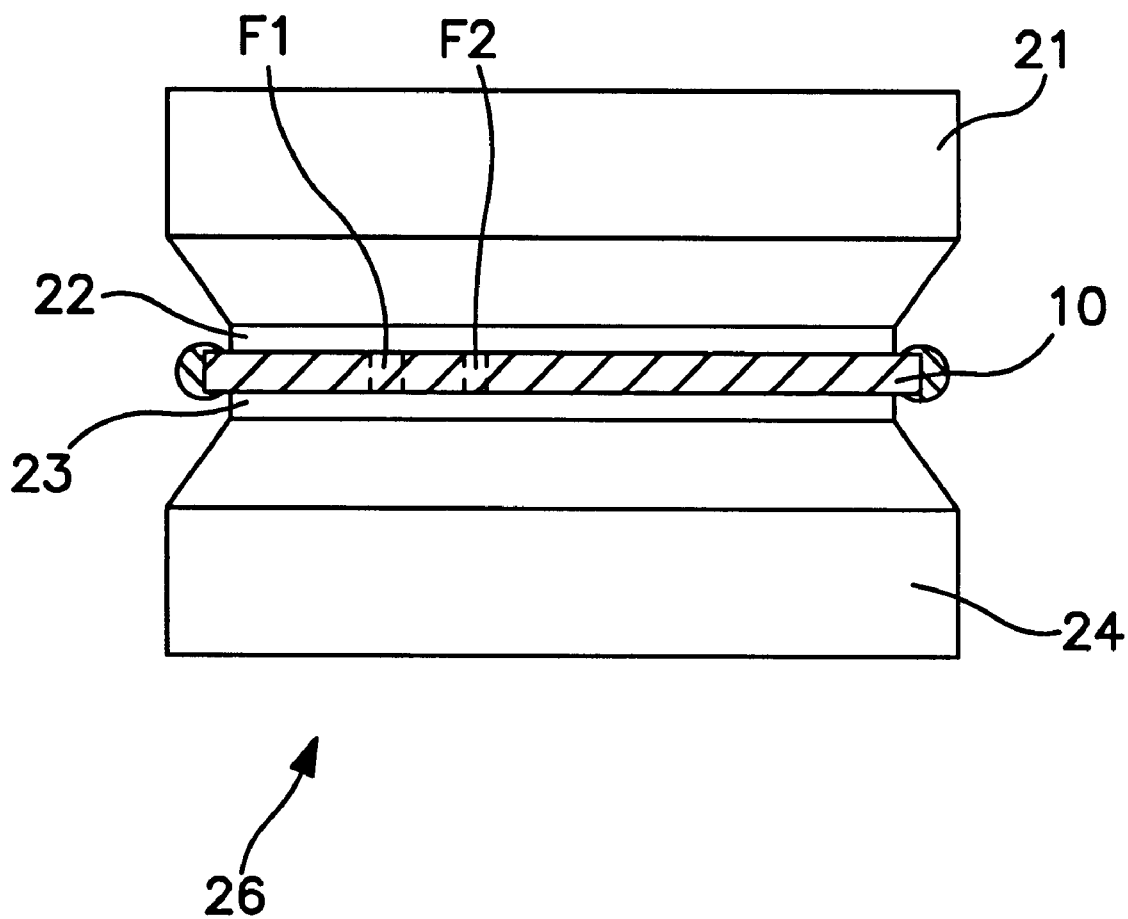
FIG. 5 shows a simplified longitudinal section through an example of the design of a power diode according to the invention with thermal contact over the entire active and deactivated surface areas.

The splitting of the substrate surface into active and deactivated sub-areas also governs the reduction in the thermal resistance $R_{th}$, related to the active area of the diode, of a power diode 26 produced with this semiconductor substrate 10, as is illustrated by way of example in FIG. 5. The semiconductor substrate 10 produced using the method according to the invention is in this case arranged between two electrode disks 21, 24 (composed of Cu) which make electrical and thermal contact with the semiconductor substrate 10 over the entire area on both sides—via compensating intermediate disks 22, 23 (composed of Mo). The concentric insulating housing is not shown. Within the semiconductor substrate 26, there are now distributed surface areas F1, which belong to the active area of the diode, and surface areas F2 which are electrically deactivated owing to the second bombardment (only one of these surface areas is in each case shown, by way of example, in FIG. 5).

The sub-areas of the diode which carry no forward current or a reduced forward current owing to the additional bombardment produce no switching losses, or only reduced switching losses, when the power diode 26 is being switched off. The total area in which the switch-off losses are generated thus becomes smaller. However, as before, the heat losses which are produced are "distributed" over the entire semiconductor substrate 10 and are passed outward via the intermediate disks 22, 23 and the electrode disks 21, 24. The masked electron bombardment thus reduces the active area in which the switching losses are produced. At the same time, however, the total area for thermal dissipation of the heat which is produced to the exterior remains unchanged. Depending on the surface area which is covered (during the bombardment) this results in a reduction of the thermal resistance $R_{th}$ related to the active area of the power diode 26.

LIST OF REFERENCE SYMBOLS

10 Semiconductor substrate
11,..., 13 Layer
14 Ion bombardment
15 Electron bombardment
16 Perforated plate (mask)
17 Hole
18 Gauze (mask)
19, 20 Steel wire
21, 24 Electrode disk (Cu)
22, 23 Intermediate disk (Mo)
26 Power diode
a–f Curve
F1, F2 Surface area It will be appreciated by those skilled in the art that the present invention can be embodied in other specific forms without departing from the spirit or essential characteristics thereof, and that the invention is not limited to the specific embodiments described herein. The presently disclosed embodiments are therefore considered in all respects to be illustrative and not restrictive. The scope of the invention is indicated by the appended claims rather than the foregoing description, and all changes that come within the meaning and range and equivalents thereof are intended to be embraced therein.

What is claimed is:

1. A method for producing a high-speed power diode with soft recovery, in which method the carrier life within the associated semiconductor substrate is governed by first, unmasked bombardment with an axial profile and by subsequent, second, masked bombardment with a lateral profile, wherein the first, unmasked bombardment is ion bombardment which governs the switching response of the power diode and in that the second, masked bombardment is electron bombardment, which reduces the active area of the power diode.

2. The method as claimed in claim 1, wherein protons or helium ions are used for ion bombardment.

3. The method as claimed in claim 1, wherein a perforated plate, preferably composed of steel or molybdenum, is used for the second, masked bombardment.

4. The method as claimed in claim 1, wherein a gauze, preferably composed of steel wire, is used for the second, masked bombardment.

5. The method as claimed in claim 4, wherein the gauze is composed of steel wire and in that the steel wire has a wire thickness such that, for a given acceleration energy of the electrons for the second bombardment, said steel wire produces total shielding at the nodes in the gauze and partial shielding of the electron bombardment in the areas which are covered by only one of the steel wires.

6. The method as claimed in claim 5, wherein the steel wire has a wire thickness of approximately 1 mm, and in that the acceleration energy of the electrons for the second bombardment is several MeV, preferably approximately 2.5 MeV.

7. The method as claimed in claim 3, wherein the surface area which is not covered by the mask is between 20% and 80% of the total area of the mask.

8. A power diode having a semiconductor substrate which is produced by means of a method as claimed in claim 1, wherein the heat is dissipated from the semiconductor substrate via the active area and the area which is deactivated by the second bombardment, so as to achieve a reduction in the thermal resistance $R_{th}$ in relation to the active area of the power diode.

9. The method as claimed in claim 7, wherein the surface area which is not covered by the mask is approximately 50% of the total area of the mask.

* * * * *